(12) United States Patent
Sun et al.

(10) Patent No.: US 9,166,131 B2
(45) Date of Patent: Oct. 20, 2015

(54) COMPOSITE LED PACKAGE AND ITS APPLICATION TO LIGHT TUBES

(71) Applicant: Tai-Yin Huang, Macungie, PA (US)

(72) Inventors: Tseng-Bao Sun, Taichung (TW); Jr-Jie Wang, New Taipei (TW)

(73) Assignee: Tai-Yin Huang, Macungie, PA (US)

( * ) Notice: Subject to any disclaimer, the term of this patent is extended or adjusted under 35 U.S.C. 154(b) by 42 days.

(21) Appl. No.: 13/943,906

(22) Filed: Jul. 17, 2013

(65) Prior Publication Data

US 2015/0021648 A1    Jan. 22, 2015

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *H01L 29/267* | (2006.01) |
| *H01L 23/48* | (2006.01) |
| *H01L 33/62* | (2010.01) |
| *F21K 99/00* | (2010.01) |
| *H01L 33/38* | (2010.01) |
| *H01L 33/20* | (2010.01) |
| *H01L 25/075* | (2006.01) |
| *H01L 33/54* | (2010.01) |
| *F21Y 101/02* | (2006.01) |
| *F21Y 103/00* | (2006.01) |

(52) U.S. Cl.
CPC . *H01L 33/62* (2013.01); *F21K 9/17* (2013.01); *F21Y 2101/02* (2013.01); *F21Y 2103/003* (2013.01); *H01L 25/0753* (2013.01); *H01L 33/20* (2013.01); *H01L 33/38* (2013.01); *H01L 33/54* (2013.01); *H01L 2224/48091* (2013.01)

(58) Field of Classification Search
CPC ..... H01L 33/32; H01L 33/20; H01L 33/0079; H01L 33/38; H01L 33/62; H01L 33/486; H01L 33/60; H01L 33/54; H01L 33/56; H01L 2224/48091; H01L 2224/16; H01L 2924/01079; H01L 2924/01078; H01L 25/0753; H01L 23/5389; B82Y 20/00; H05K 1/182
USPC ................. 257/79, 81, 99, 100, 696; 361/761
See application file for complete search history.

(56) References Cited

U.S. PATENT DOCUMENTS

| | | | | |
|---|---|---|---|---|
| 4,084,312 | A * | 4/1978 | Kirk et al. ........................ | 29/827 |
| 4,157,486 | A * | 6/1979 | Fegley ............................ | 315/71 |
| 4,446,375 | A * | 5/1984 | Aird ............................... | 250/551 |
| 4,863,806 | A * | 9/1989 | Merrick et al. ................ | 428/571 |
| 4,877,756 | A * | 10/1989 | Yamamoto et al. ............ | 438/25 |
| 4,893,169 | A * | 1/1990 | Rusch et al. .................... | 257/92 |
| 5,302,921 | A * | 4/1994 | Shigemori et al. ............. | 331/67 |
| 5,489,800 | A * | 2/1996 | Brown et al. .................. | 257/666 |
| 6,373,078 | B1 * | 4/2002 | Yea ................................. | 257/81 |
| 7,973,332 | B2 * | 7/2011 | Fukui ............................. | 257/99 |
| 8,455,889 | B2 * | 6/2013 | Lee et al. ........................ | 257/88 |
| 8,840,265 | B2 * | 9/2014 | Moon et al. .................... | 362/219 |
| 2002/0185649 | A1 * | 12/2002 | Oshio ............................ | 257/81 |
| 2003/0189829 | A1 * | 10/2003 | Shimizu et al. ............... | 362/240 |
| 2006/0086384 | A1 * | 4/2006 | Nakata .......................... | 136/250 |
| 2008/0135993 | A1 * | 6/2008 | Huang et al. .................. | 257/673 |
| 2009/0230413 | A1 * | 9/2009 | Kobayakawa et al. .......... | 257/91 |
| 2011/0186902 | A1 * | 8/2011 | Egoshi et al. .................. | 257/99 |
| 2013/0027930 | A1 * | 1/2013 | Kobayakawa et al. ........ | 362/235 |

* cited by examiner

*Primary Examiner* — Teresa M Arroyo
(74) *Attorney, Agent, or Firm* — Rosenberg, Klein & Lee

(57) ABSTRACT

A light emitting diode package includes a first lead frame, a second lead frame and an encapsulant. The first lead frame has a die deposition area on the top thereof for disposing LED die. The second lead frame has a contacting face on the top thereof for wire bonding. The die deposition area of the first lead frame has a first adhesion area such that the encapsulant is held by the first adhesion area when enclosing the top and bottom of the first and second lead frames. The light is emitted in all directions.

9 Claims, 9 Drawing Sheets

COMPOSITE LED PACKAGE AND ITS APPLICATION TO LIGHT TUBES

BACKGROUND

1. Field of the Invention

The instant disclosure relates to a light emitting diode (LED) package; in particular, to a composite LED package including the processing of LED lamp package and surface mounted device (SMD) package. The composite LED package allows for a wider viewing angle and applies to light tubes.

2. Description of Related Art

Due to the fast improvement of light emitting diode (LED) technology, LED has been widely used in lighting. LED lamp package, surface mounted device (SMD), flip-chip and chip on board (COB) are common methods for producing LED. However, after packaging, the viewing angle of LED is relatively restricted by the packaging materials and configuration. The resulting viewing angle is less than 180° let alone a desired 360° viewing angle. The LED package for lighting has been changed because of the enhancement of LED chip performance and packaging. From LED lamp package, SMD, PLCC, High-Power, Multi-Chips to the most widely used COB, the viewing angle is fixed. For example, as shown in FIG. 1A, a conventional LED lamp package 100' includes an LED die 1' and a pair of pins 2'. One of the pins 2' is configured to a reflector cup 3' for retaining the LED die 1'. A plastic lens 4' encloses the LED chip 1' and the reflector cup 3'. The reflection cup 3' confines the LED light emitting direction.

Additionally, as shown in FIG. 1B, a conventional SMD package 200' includes a substrate 10' formed by injection molding. A lead frame 11' is fastened on the substrate 10' and together they form a packaging substrate. An LED die 12' is attached onto the lead frame 11' and an optical lens 14' covers the top of the substrate 10'. One electrode of the LED die 12' is immediately electrically connected to the lead frame while the other electrode is connected by wire bonding to the lead frame by a bond wire 15'. The non-translucent and heat resistant substrate 10' also confines the LED light emitting direction. When the LED chips illuminate, a portion of light is absorbed by the substrate 10', or light reflection and refraction occur. Most of the light is absorbed after several rounds of reflection and refraction. Therefore, the luminance of the LED device is greatly compromised and energy is wasted in the internal light propagation. Furthermore, the conventional SMD package requires higher fabrication cost because the manufacturing process includes metal pressing and plastic injection molding to form the costly heat resistant substrate 10'.

Moreover, the conventional lens is made of highly translucent resin or other plastic materials and the light rays are concentrated on/at a bright spot. The viewing angle rarely exceeds 90° and mostly falls between 18° and 60°. Even the most widely used COB LED only provides a viewing angle less than 180°. A 360° viewing angle is desired in various applications. The incandescent lamp and fluorescent lamp have a wider viewing angle and are cost effective, thus more appealable to the consumers than the LED.

SUMMARY OF THE INVENTION

The instant disclosure provides a composite light emitting diode (LED) package including the advantages of LED lamp and surface mounted device (SMD) package. The composite LED package can be rapidly fabricated in mass production and a light tube is using the same composite LED package. The composite LED package also has a wider viewing angle.

According to one embodiment of the instant disclosure, the composite LED package for accommodating LED die and wire bonding includes a first lead frame, a second lead frame and an encapsulant. The first lead frame has a die deposition area for disposing (at least one) die and a first extension electrode. The die deposition area is arranged on a top face of the first lead frame and has at least a first adhesion area surrounding the peripheral portion of the die deposition area. The second lead frame has a contacting face allowing wire attachment and a second extension electrode. The contacting face is arranged on a top face of the second lead frame. At least one of the wires is bonded with the at least one LED die. The encapsulant encloses the top faces of the first and second lead frames and the bottom faces of the first and second lead frames to encapsulate the LED die. The encapsulant is attached to the first adhesion area of the first lead frame.

In the instant disclosure, the LED die, bond wire and adhesive can be applied on the lead frame directly and the encapsulant encloses the lead frame entirely. The instant disclosure is applicable in mass production and the manufacturing cost and process are significantly reduced. Also, the encapsulant is secured by the lead frame such that the viewing angle is broader compared to the conventional LED lamp package.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
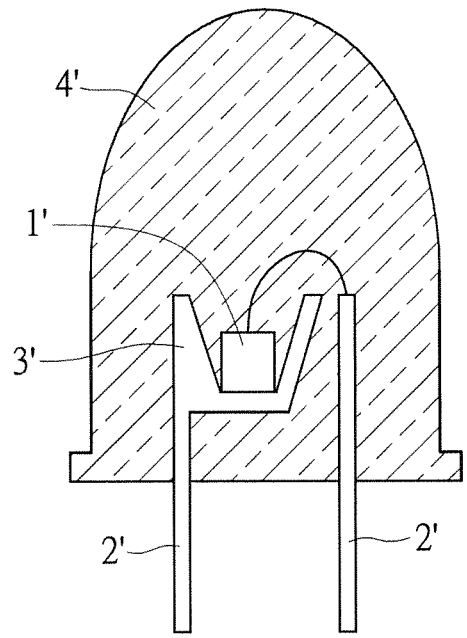
FIG. 1A is a cross-sectional view of a conventional LED lamp package.
Figure 1B:
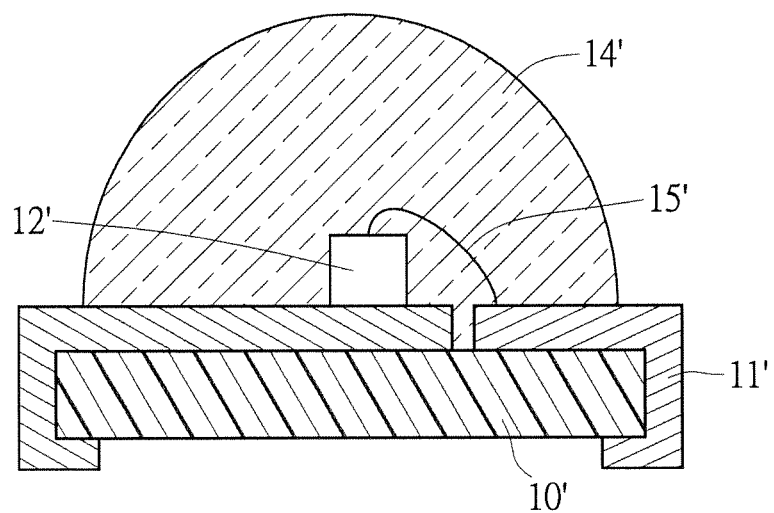
FIG. 1B is a cross-sectional view of a conventional SMD package.
Figure 2:
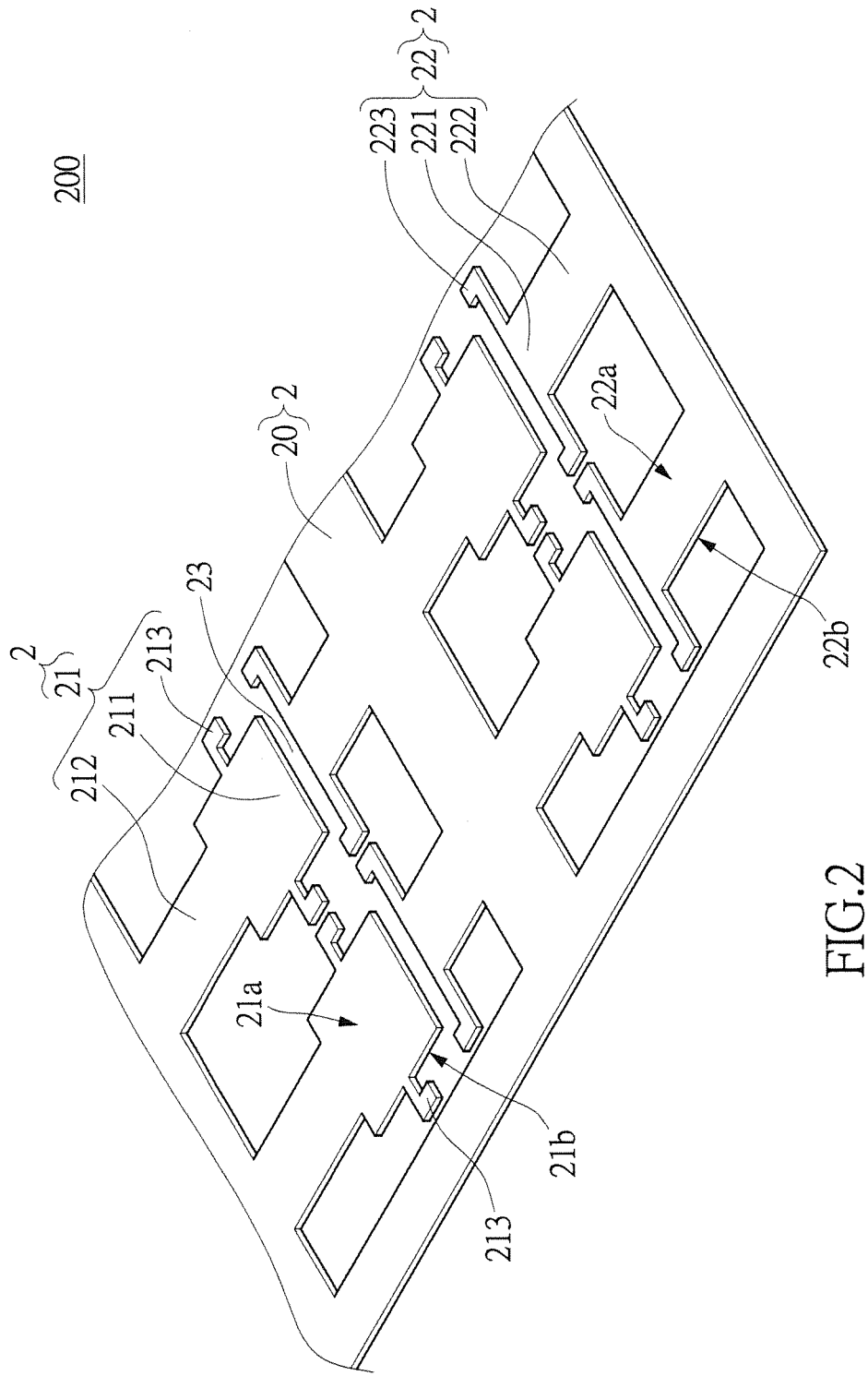
FIG. 2 is a perspective view of a lead frame of the instant disclosure.
Figure 3:
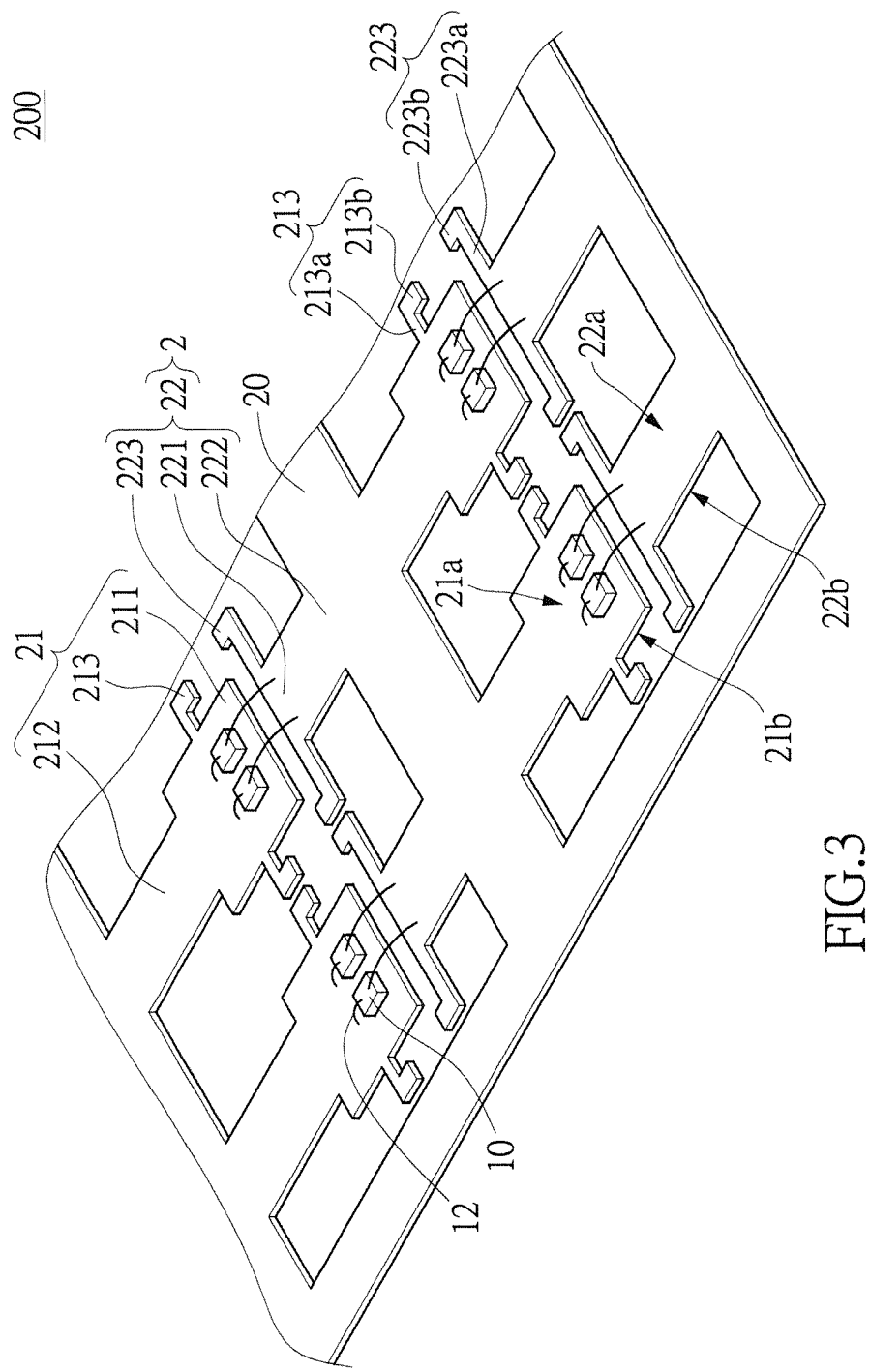
FIG. 3 is a perspective view of a lead frame with LED dies and bond wires of the instant disclosure.
Figure 4:
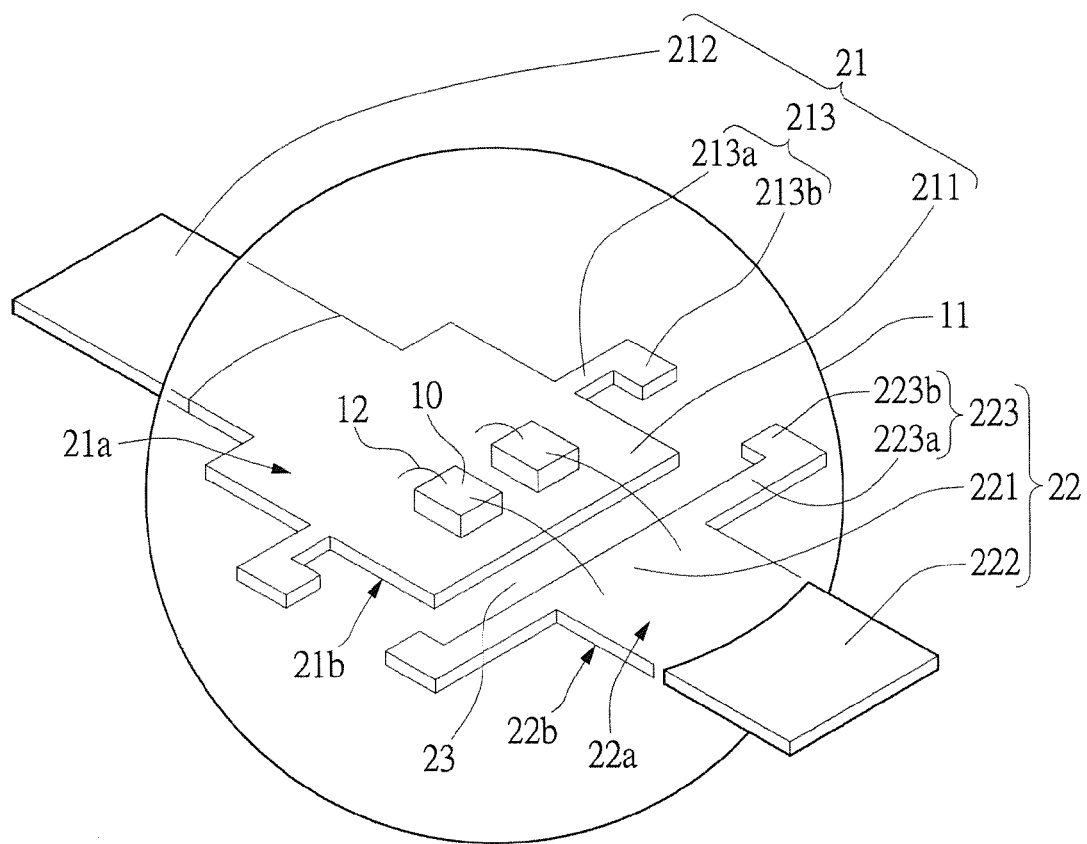
FIG. 4 is a perspective view of a single composite LED package of the instant disclosure.
Figure 5A:
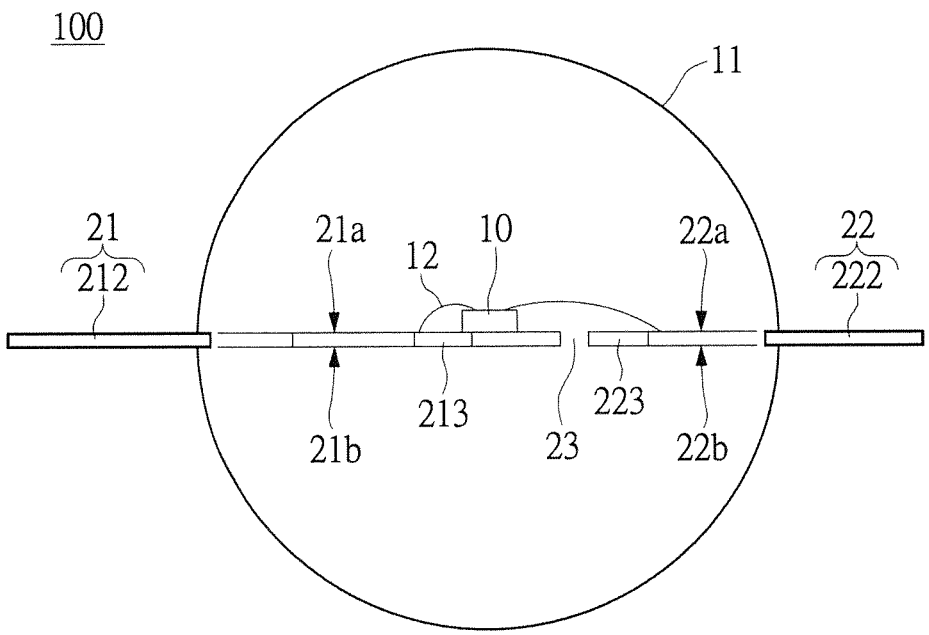
FIG. 5A is a cross-sectional view of a single composite LED package of the instant disclosure.
Figure 5B:
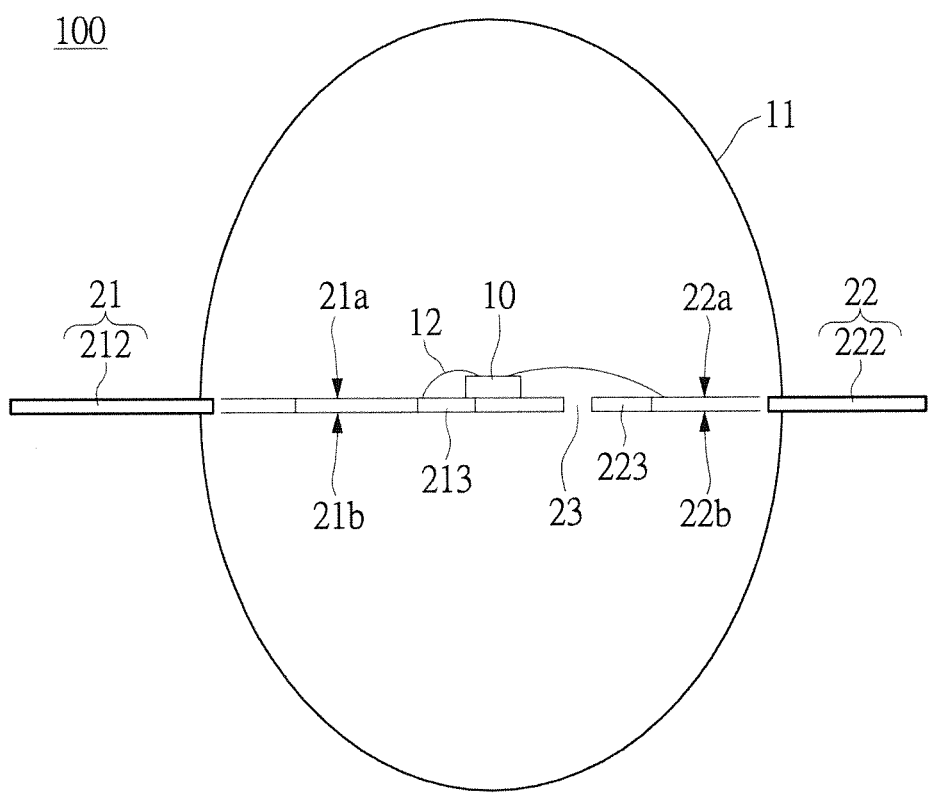
FIG. 5B is a cross-sectional view of another single composite LED package of the instant disclosure.

Referring to FIGS. 2 to 4, as shown in FIG. 2, the instant embodiment provides a LED package 100. The LED package 100 includes a lead sheet 200. The lead sheet 200 includes a plurality of abreast lead frames 2. Each lead frame 2 has a fringe 20, a first lead frame 21 and a second lead frame 22. The first and second lead frames 21, 22 are connected by the fringes 20. Each of the first and second lead frames 21, 22 are spaced apart by a predetermined interval. The lead sheet 200 is formed by cutting a metallic sheet. The lead frames 2 are connected by the fringe 20 in an array. In other words, the fringe 20 serves to connect the first and second lead frames 21, 22 by connecting along their edges. The first lead frame 21 has a die deposition area 211 and a first extension electrode 212. The die deposition area 211 retains LED dies 10 on a top face 21a of the first lead frame 21. Furthermore, the die deposition area 211 has at least one bendable first adhesion area 213. The second lead frame 22 has a contacting face 221 located on a top face 22a thereof and a second extension electrode 222. The contacting face 221 allows wires 12 for attachment. The first adhesion area 213 defines the periphery of the LED dies 10. In the instant embodiment, the first and second lead frames 21, 22 are parallel, and the second extension electrodes 222 and the 212 are on the opposite sides of the LED dies 10. The first and second lead frames 21, 22 define a filler channel 23 therebetween. It is worth noting that the second lead frame 22 also has at least one bendable second adhesion area 223. The first adhesion area 213 of the first lead frame 21 has a first protrusion 213a connected to the die deposition area 211 and a first bendable portion 213b bent from the first protrusion 213a. Similarly, the second lead frame 22 also has a bendable second adhesion area 223 which includes a second protrusion 223a connected to the second lead frame 22 and a second bendable portion 223b bent from the second protrusion 223a.

In the instant embodiment, preferably, two first adhesion areas 213 stretch out from two sides of the die deposition area 211 of the first lead frame 21. Two second adhesion areas 223 also stretch out from the front of the contacting face 221 of the second lead frame 22. The first and second adhesion areas 213, 223 are opposite to one another. More specifically, the first protrusion 213a and the first bendable portion 213b of the first adhesion area 213 resemble an "L". The second protrusion 223a and the second bendable portion 223b of the second adhesion area 223 also resemble an "L". The L-shaped protrusions and bendable portions enable the first and second adhesion areas 213, 223 to hold an encapsulant 11 (shown in FIG. 4).

As shown in FIG. 3, in the instant embodiment, the lead sheet 200 is firstly stamped and cut to form the plurality of lead frames 2 during production of 100. The die attaching and wire bonding are then performed and the encapsulant is secured to the lead frames 2. A complete single composite LED package 100 is shown in FIG. 4. Furthermore, the composite LED package 100 (as shown in FIG. 4) includes the first lead frame 21, the second lead frame 22, the at least one LED die 10, the at least one wire 12 and the encapsulant 11.

Referring to FIGS. 2 to 4, FIG. 2 is a perspective view of the lead frame of the instant disclosure. In the instant embodiment, the frame is firstly fabricated. The lead sheet 200 that includes the plurality of connected lead frames 2 is provided. Each lead frame 2 has the first lead frame 21 and the second lead frame 22. The first and second lead frame 21, 22 collectively define the filler channel 23. Preferably, the second extension electrode 222 of the second lead frame 22 and the first extension electrode 212 of the first lead frame 21 are on opposite sides of the LED dies 10 (shown in FIG. 3).

Subsequently, die bonding is performed. Please refer to FIG. 3 showing a perspective view of die and wire bonding of the composite LED package. At least one LED die 10 is disposed on the die deposition area 211 of the first lead frame 21. The LED die 10 emits the light having a wavelength between UV and IR spectrum. Then, one end of the wire 12 is attached to an electrode contact point (not shown) on the LED die 10. The other end of the wire 12 is bonded to the contacting face 221 of the second lead frame 22. Note that the contacting face 221 for wire bonding is approximately level with the first lead frame 21 and therefore the wire 12 may have a preferable bending curve because the wire bonding machine is not restricted by a spatial confinement.

After the wire 12 is bonded to the LED die 10 and the contacting face 221 of the second lead frame 22, adhesive can be applied. Please refer to FIG. 4 showing a perspective view of a single LED package of the instant disclosure. The encapsulant 11 encloses portions of the first and second lead frames 21, 22 and the LED die 10 is also packed therein. The encapsulant 11 may be mixed with fluorescent powders for increasing light evenness. When packing the LED die 10, the encapsulant 11 encloses the first and second lead frames 21, 22 by clamping top and bottom, glue injection and stamping. Because the encapsulant 11 of the 100 of the present disclosure is formed by stamping for enclosing the LED die 10, the composite LED package 100 has a simplified fabrication process and the material cost is cut down. It is worth mentioning that in the presence of the filler channel 23 between the first and second lead frames 21, 22, the encapsulant 11 can go through the filler channel 23 from the top faces 21a, 22a of the first and second lead frames 21, 22 to the bottom faces 21b, 22b of the same. As a result, the encapsulant 11 is firmly attached to the lead frames due to the continuous contour. In addition, the first and second adhesion areas 213, 223 of the first and second lead frames 21, 22 are integrated with the encapsulant 11 and therefore the encapsulant 11 and the first and second lead frames 21, 22 are tightly engaged. The encapsulant 11 is securely retained on the first and second lead frames 21, 22. In other words, the first and second adhesion areas 213, 223 serve to firmly secure the encapsulant 11 to the lead frames 21, 22.

Figure 6A:
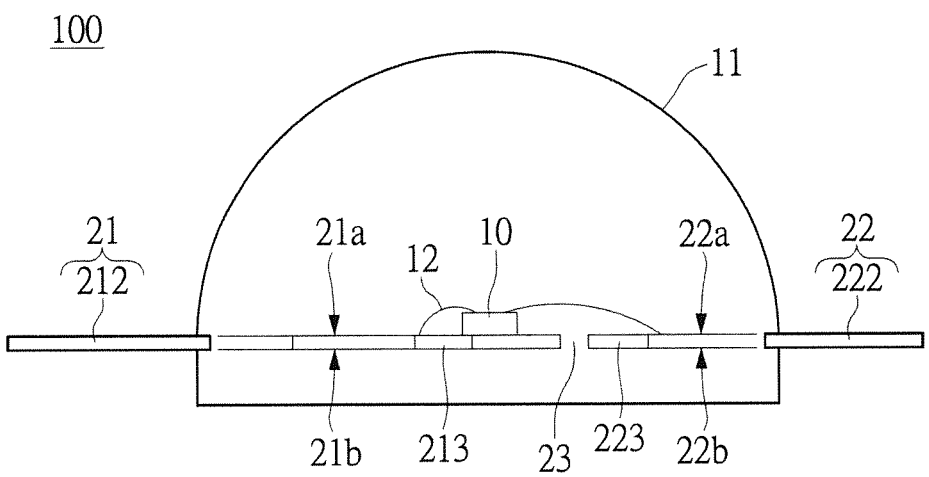
FIG. 6A is a cross-sectional view of still another single composite LED package of the instant disclosure.
Figure 6B:
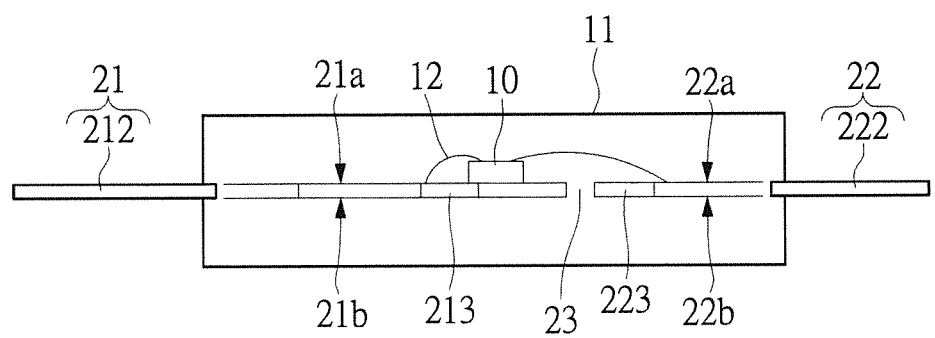
FIG. 6B is a cross-sectional view of another single composite LED package of the instant disclosure.
Figure 7:
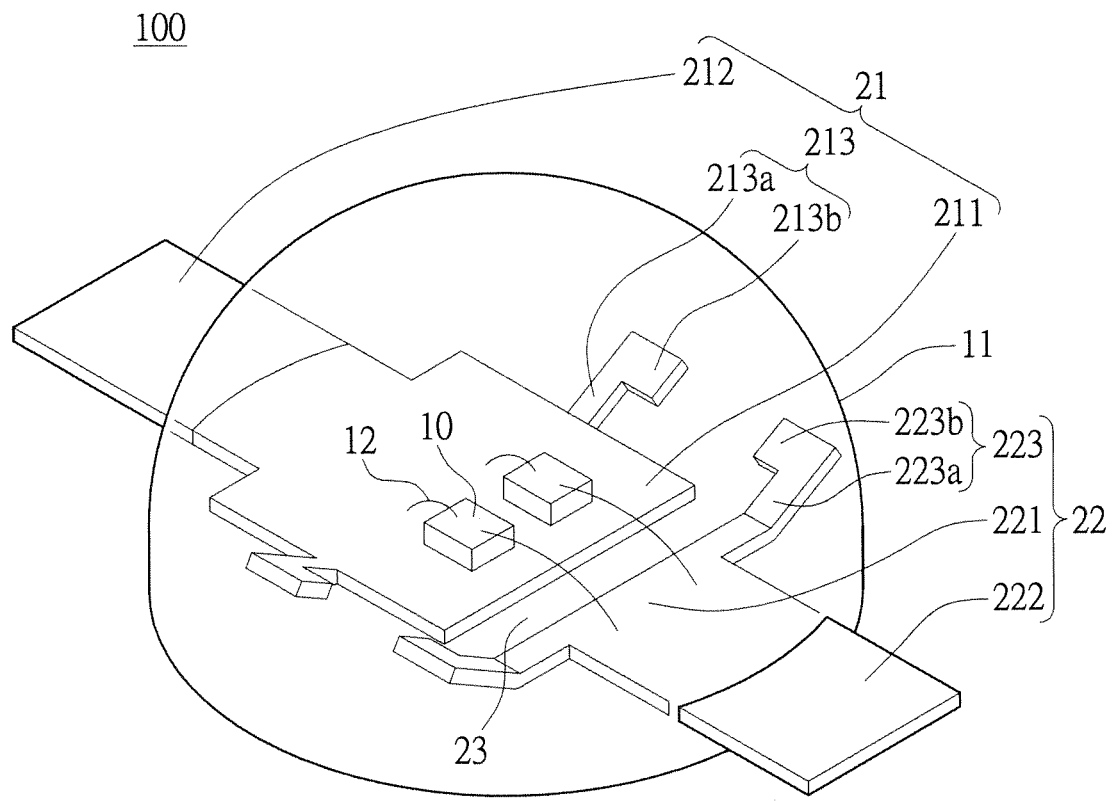
FIG. 7 is a perspective view of another single LED package of the instant disclosure.
Figure 8:
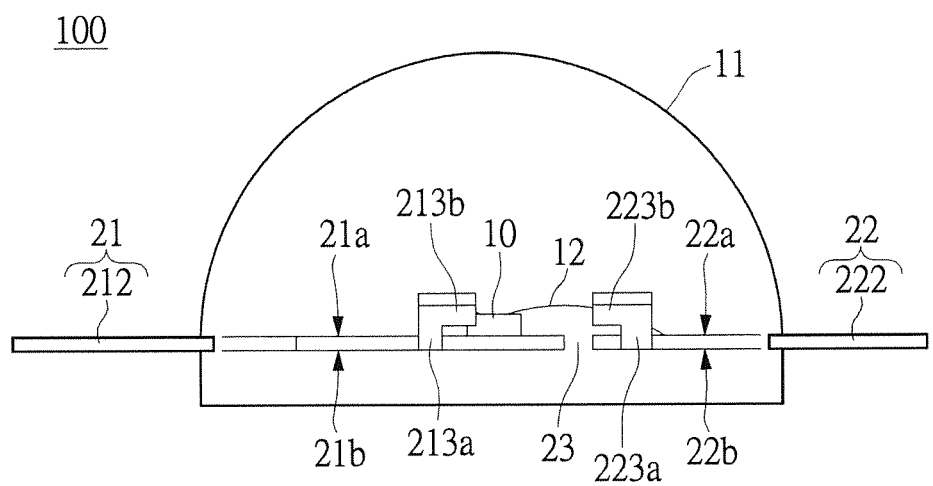
FIG. 8 is a cross-sectional of another single LED package of the instant disclosure.

Specifically, after the die and wire bonding, the configuration of first and second adhesion areas 213, 223 of the 21 and 22 is determined by the shape of the encapsulant 11. For example, as shown in FIGS. 4 to 6B, when the first and second adhesion areas 213, 223 are respectively co-planar with the first and second lead frames 21, 22, the encapsulant 11 is formed as a ball (FIG. 5A), an ellipse (FIG. 5B), half ball and half plate (FIG. 6A), or a plate (FIG. 6B). More specifically, when the first and second protrusions 213a, 223a are respectively co-planar with the first and second lead frames 21, 22, i.e. the 213a and the 223a are not bent, the encapsulant 11 can be formed into the aforementioned configuration. The first and second adhesion areas 213, 223 firmly secure the encapsulant 11 to the first and second lead frames 21, 22. Additionally, as shown in FIGS. 7 and 8, when the first and second adhesion areas 213, 223 are respectively not co-planar with the first and second lead frames 21, 22, the encapsulant 11 is configured to half sphere or plate (not shown). Specifically, when the first and second protrusions 213a, 223a are bent upward, the encapsulant 11 is tightly grasped by the first and second bendable portions 213b, 223b and 213a, 223a, and the materials used as well as the cost are reduced because 11 is needed for the upper part only. As shown in FIGS. 7 and 8, the first and second protrusions 213a, 223a are bent less than 90° and therefore the viewing angle of LED die 10 is not affected.

In the abovementioned adhesion processing, the encapsulant 11 can be made of highly translucent silicone gel or epoxy. In the conventional surface mounted device (SMD) processing, an optical lens has to cover the encapsulant 11 yet this step can be omitted in the instant disclosure. That is to say, the encapsulant 11 acts as the optical lens and therefore the fabrication cost and time are reduced. Moreover, the first and second lead frames 21, 22 are made of metallic materials (for example, copper) having preferable heat conductivity. Hence, after a long period of illumination, the temperature of LED die 10 does not raise and the encapsulant 11 is protected from high temperature damage. The life span of the LED die 10 and the encapsulant 11 is prolonged.

After the encapsulant 11 is attached to the lead frame 2, a removal process is performed. The first and second lead frames 21, 22 are cut from the fringe 20 to single out the composite LED package 100 as shown in FIGS. 4 and 7. The composite LED package 100 can be implemented in different applications in an array or as a plane.

Because the encapsulant 11 encloses top and bottom of the first and second lead frames 21, 22 and the filler channel 23 is formed between the first and second lead frames 21, 22, when the LED die 10 emits light, most of the light scatters out from the top faces 21a, 22a of the first and second lead frames 21, 22. A portion of the light is reflected and travels through the filler channel 23, and is emitted from the bottom faces 21b, 22b of the first and second lead frames 21, 22. Another portion of the light is reflected by the encapsulant 11 and emitted from the bottom faces 21b, 22b of the first and second lead frames 21, 22. In other words, the light emitted by the LED die passes through the encapsulant 11 in different directions to enlarge the viewing angle. The light emitting rate and viewing angle of the composite LED package 100 is greatly enhanced and light energy is saved.

In short, the lead frame and adhesive application process of LED lamp package and the die and wire bonding of SMD package are used in the composite LED package 100. Therefore on the same lead sheet 200, the plurality of composite LED packages are mass produced rapidly. Compared to the SMD package, the composite LED package 100 requires metal stamping but not injection molding. (Please refer to the prior art.) Therefore the fabrication time and cost are reduced and the process speed is increased.

Figure 9:
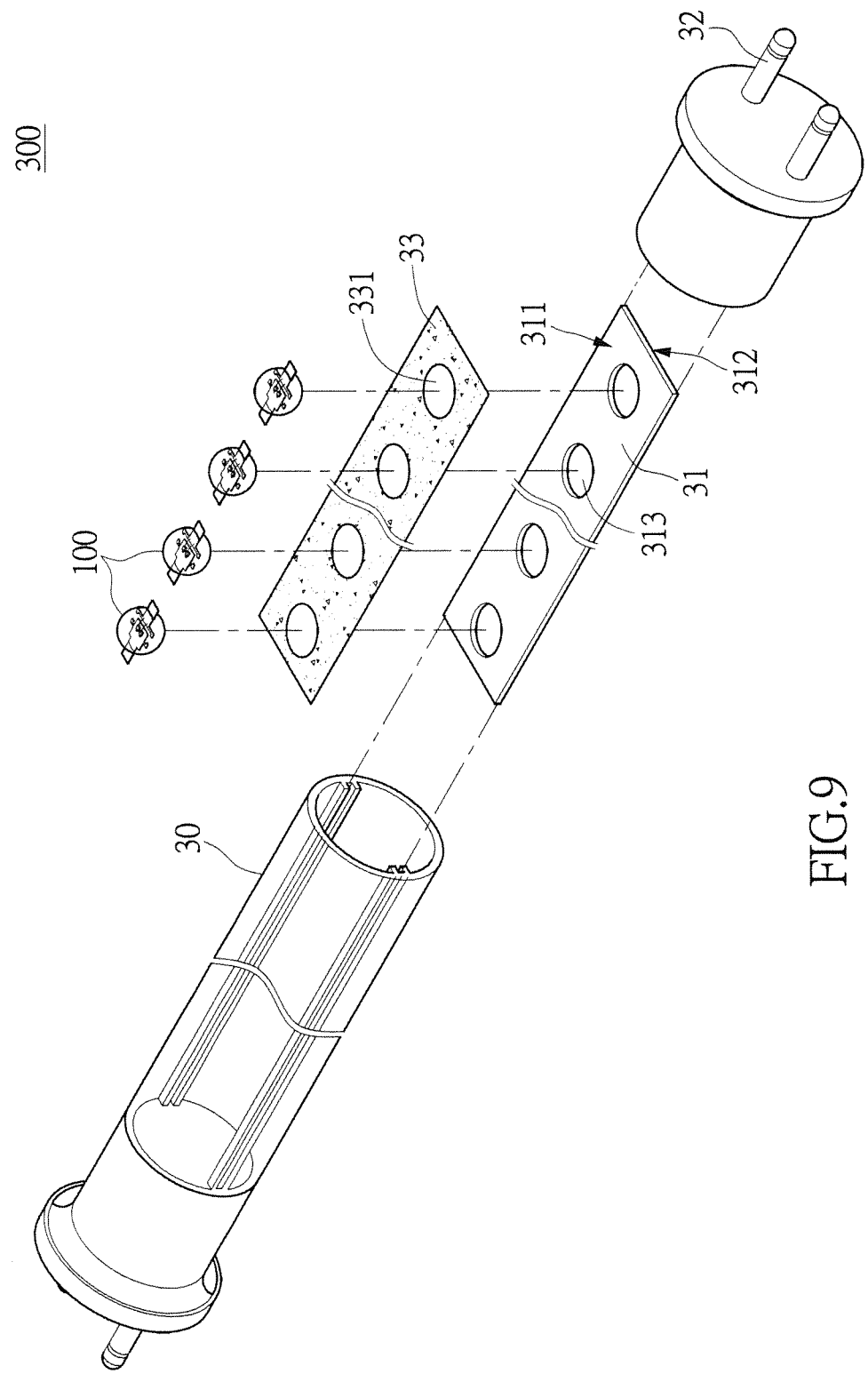
FIG. 9 is a schematic view of a LED light tube of the instant disclosure.
Figure 10:
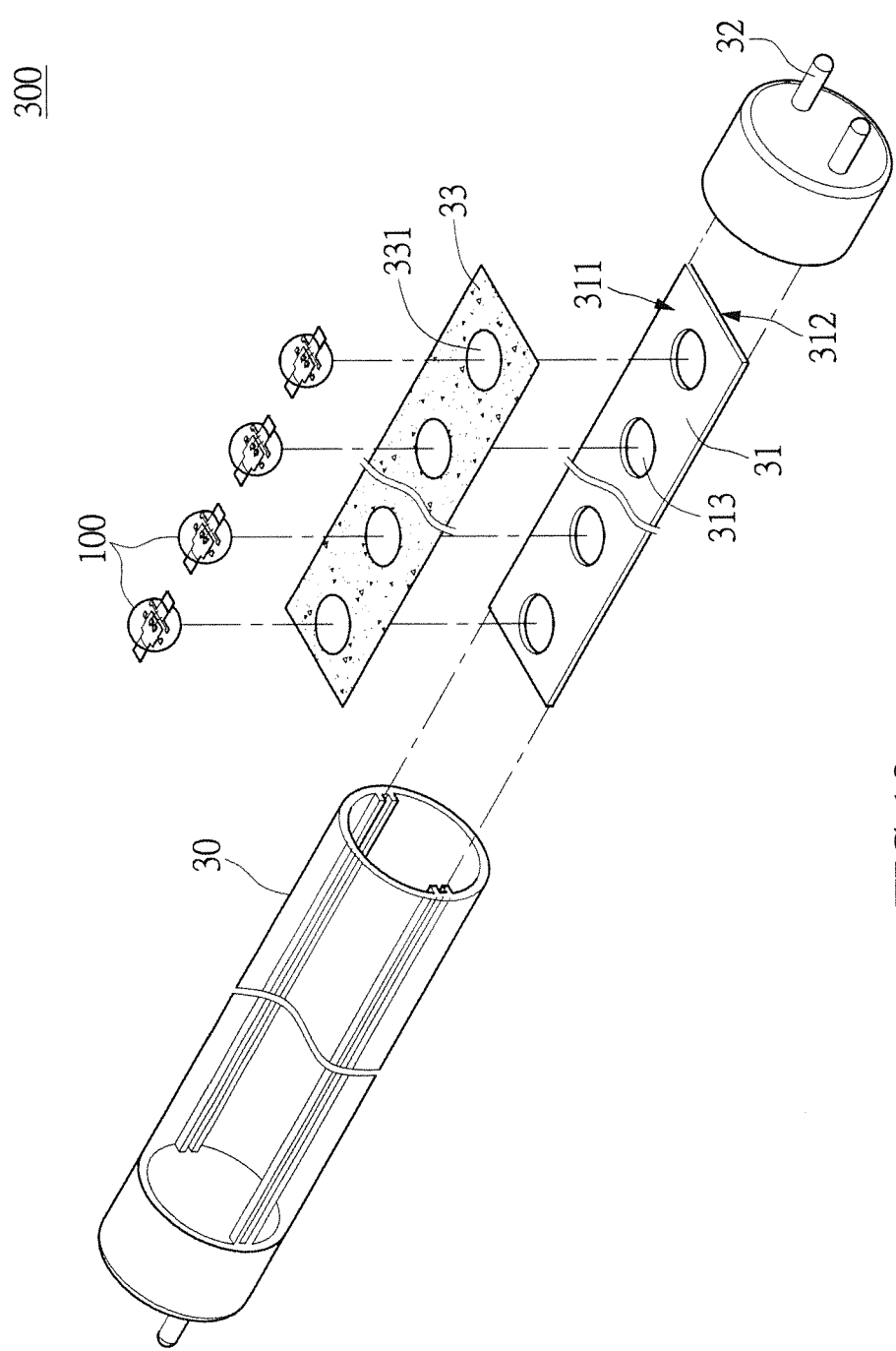
FIG. 10 is a schematic view of another LED light tube of the instant disclosure.

Please refer to FIGS. 9 and 10 showing a light tube 300 using the composite LED package 100. The light tube 300 can be used in an advertisement light box including more than one face yet the instant disclosure is not limited thereto.

The light tube 300 includes a tube 30, a board 31, the plurality of composite LED packages 100 and two pins 32. The composite LED package 100 has been described previously and the same description is omitted herein. The board 31 is disposed in the tube 30. The board 31 defines a top 311 and a bottom 312. A plurality of retaining holes 313 is formed on the board 31, going through the top 311 and bottom 312. The retaining holes 31 receive the composite LED packages 100 therein. The two pins 32 are coupled to an end of a lamp base (not shown) and allow electrical communication to the board 31 and the LED package 100. As shown in FIGS. 9 and 10, the retaining holes 313 of the board 31 receive the LED packages 100 therein and the packages are secured by welding. The LED packages 100 are electrically connected to the board 31 and the LED light tube 300 is completed. The board 31 may be made of PCB or metallic board. The LED packages 100 emits light from the top and bottom and therefore enable a 360° viewing angle of the LED light tube 300. Moreover, the size of the board 31, which retains the LED packages 100, is greatly reduced. As a result, the overall volume of light tube 300 also shrinks. The pins 32 are compatible to different light caps of fluorescent light tubes, for example, T8 (FIG. 9) and T5 (FIG. 10) and therefore the LED light tube 300 can be implemented to a broad variety of lighting apparatus. Furthermore, the overall size of the LED light tube 300 is shrunk due to the smaller LED packages 100 and a control circuit (not shown) electrically connected to the LED packages 100 and pins 32 is coupled to the outer face of the tube 30. The control circuit does not occupy the interior space.

It is worth noting that when the board 31 is a metallic board, the board 31 may have an insulating layer 33. The insulating layer 33 prevents short circuiting when electrically connecting the LED packages 100 and the board 31. The insulating layer 33 also has a plurality of openings 331 corresponding to the retaining holes 313. The LED packages 100 can also be received therein. In the instant embodiment, the insulating layer 33 is made of silicone gel. In addition, the LED packages 100 can be adjusted to allow the LED light tube 300 for a 360° viewing angle. For example, when each LED package 100 faces the same side of the board 31, this side show higher brightness and the other side is relatively dim. When the LED packages 100 face different sides of the board 31, the light of LED light tube 300 is more evenly distributed.

It should be emphasized that the abovementioned directions, for example, top, bottom, left, right, front or rear, are referred to the orientation shown in the figures and the instant disclosure is not limited thereto.

The LED package of the instant disclosure combines the fabrication advantages of the LED lamp and SMD package including the lead frame and adhesion steps from the LED lamp process and the die and wire bonding steps from the SMD package process. Hence on the same lead sheet, the plurality of LED packages can be rapidly mass produced. The process speed is increased and the material cost decreases.

The lead frame holds the encapsulant and therefore the light emitted by LED die travels in all directions. The viewing angle is greatly increased.

Specifically, the bendable adhesive area of the lead frame holds the encapsulant. As a result, the material cost is reduced and the product is more competitive, environmental friendly and cost effective.

The encapsulant of the instant disclosure replaces the conventional optical lens in the SMD package. The manufacturing cost and time are reduced thereby.

The lead frame of the instant disclosure exhibit good heat conductivity. After long period of use, the heat does not accumulate around the LED die and the damages caused by high temperature are avoided. The lifetime of the LED die and encapsulant are both increased.

The overall volume of the LED light tube shrinks and the pins can be adapted to a variety of light caps. In other words, the LED light tube is compatible with different fluorescent light tubes. The implementation of the LED light tube is broader.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An LED package for LED die deposition and wire bonding comprising:
   a first lead frame including:
      a die deposition area on the top face of the first lead frame for disposing at least one LED die, the die deposition area having a first adhesion area at the periphery of the LED die; and
      a first extension electrode disposed on one end of the die deposition area;
   a second lead frame including:
      a contacting face on the top face of the second lead frame;
      a wire having one end bonded to the contacting face and the other end bonded to the LED die;
      a second extension electrode disposed on one end of the contacting face; and
   an encapsulant enclosing the LED die from the top to the bottom of the first and second lead frames;
   wherein the first adhesion area is embedded by the encapsulant,
   wherein the first and second lead frames are parallel, the second extension electrode and the first extension electrode are disposed on opposite sides of the LED die, and the first and second lead frames define a filler channel therebetween;
   wherein the encapsulant extends from the top to the bottom of the first and second lead frames by going through the filler channel;
   wherein the first adhesion area includes a first protrusion and a first bendable portion, one end of the first protrusion connects to the die deposition area and the other end thereof connects to the first bendable portion;
   wherein the first protrusion is bent and the first bendable portion is higher than the die deposition area.

2. The LED package according to claim 1, wherein the second lead frame has a second adhesion area, which includes a second protrusion and a second bendable portion, one end of the second protrusion connects to the second lead frame and the other end connects to the second bendable portion.

3. The LED package according to claim 2, wherein the second protrusion is bent and the second bendable portion is higher than the contacting area.

4. The LED package according to claim 2, wherein one front end of the die deposition area of the first lead frame has two first adhesion areas, one front end of the contacting face of the second lead frame has two second adhesion areas, and the first and second adhesion areas are opposite to each other.

5. The LED package according to claim 2, wherein the first and second adhesion areas each resemble an L-shape.

6. The LED package according to claim 1, wherein the encapsulant is made of silicone or epoxy.

7. An LED light device comprising:
   a tube;
   a board disposed in the tube and defining a top and a bottom, and is formed with a plurality of retaining holes going through the top and bottom;
   a plurality of LED packages respectively received by the retaining holes and electrically interconnected to each other, each LED package including:
      a first lead frame including:
         a die deposition area for disposing at least one LED die, the die deposition area having a first adhesion area at the periphery of the LED die; and
         a first extension electrode disposed on one end of the die deposition area;
      a second lead frame including:
         a contacting face; and
         a second extension electrode disposed on one end of the contacting face;
         a wire having one end bonded on the contacting face and the other end bonded to the LED die;
      an encapsulant enclosing the LED die from the top to the bottom of the first and second lead frames;
      wherein the first adhesion area is embedded by the encapsulant;
      wherein the first adhesion area includes a first protrusion and a first bendable portion, one end of the first protrusion connects to the die deposition area and the other end thereof connects to the first bendable portion;
      wherein the first protrusion is bent and the first bendable portion is higher than the die deposition area;
      wherein the second lead frame has a second adhesion area, which includes a second protrusion and a second bendable portion, one end of the second protrusion connects to the second lead frame and the other end connects to the second bendable portion;
      wherein the second protrusion is bent and the second bendable portion is higher than the contacting area; and
   two pins electrically connected to the LED packages.

8. The LED light device according to claim 7, wherein the board further includes an insulating layer formed with a plurality of openings corresponding to the retaining holes.

9. The LED light device according to claim 7, wherein the LED packages face the same side of the board.

* * * * *